United States Patent
Roohparvar et al.

(10) Patent No.: US 6,587,383 B1
(45) Date of Patent: Jul. 1, 2003

(54) ERASE BLOCK ARCHITECTURE FOR NON-VOLATILE MEMORY

(75) Inventors: Frankie Fariborz Roohparvar, Milpitas, CA (US); Kevin C. Widmer, San Carlos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/100,856

(22) Filed: Mar. 19, 2002

(51) Int. Cl.$^7$ ................................................ G11C 16/00
(52) U.S. Cl. ........................... 365/185.33; 365/185.12; 365/185.29
(58) Field of Search ....................... 365/185.33, 185.11, 365/185.12, 185.29

(56) References Cited

U.S. PATENT DOCUMENTS

| | | | | |
|---|---|---|---|---|
| 5,109,361 A | * | 4/1992 | Yim et al. ............. | 365/185.12 |
| 5,126,808 A | * | 6/1992 | Montalvo et al. ...... | 365/185.09 |
| 5,630,093 A | | 5/1997 | Holzhammer et al. ....... | 711/115 |
| 5,664,140 A | | 9/1997 | Klein ..................... | 711/211 |
| 5,720,031 A | | 2/1998 | Lindsay .................. | 714/42 |
| 5,909,392 A | * | 6/1999 | Chang .................. | 365/185.12 |
| 5,933,859 A | | 8/1999 | Klein ..................... | 711/211 |
| 5,986,933 A | * | 11/1999 | Takeuchi et al. ........ | 365/185.12 |
| 5,995,417 A | * | 11/1999 | Chen et al. ............. | 365/185.29 |
| 6,006,310 A | | 12/1999 | Klein ..................... | 711/128 |
| 6,134,677 A | | 10/2000 | Lindsay .................. | 714/42 |
| 6,330,693 B1 | | 12/2001 | Lindsay .................. | 714/42 |

* cited by examiner

*Primary Examiner*—Tan T. Nguyen
(74) *Attorney, Agent, or Firm*—Leffert Jay & Polglaze, P.A.

(57) ABSTRACT

A flash memory has erase blocks aligned primarily with array rows and secondarily with array rows. This architecture allows data to be stored across numerous pages without risking accidental erasure caused by crossing multiple erase blocks. As a result, non-volatile memory devices to be more easily substituted for volatile memory devices. In one embodiment, a flash memory includes an array of memory cells that have a plurality of adjacent pages. Addresses of the memory cells are scrambled within the pages to define erase blocks that cross the page boundaries.

19 Claims, 3 Drawing Sheets

ERASE BLOCK ARCHITECTURE FOR NON-VOLATILE MEMORY

FIELD OF THE INVENTION

The present invention relates generally to non-volatile memories and in particular the present invention relates to erase architectures for a non-volatile flash memory.

BACKGROUND OF THE INVENTION

Memory devices are available in a variety of styles and sizes. Some memory devices are volatile in nature and cannot retain data without an active power supply. A typical volatile memory is a DRAM which includes memory cells formed as capacitors. A charge, or lack of charge, on the capacitors indicate a binary state of data stored in the memory cell. Dynamic memory devices require more effort to retain data than non-volatile memories, but are typically faster to read and write.

Non-volatile memory devices are also available in different configurations. For example, floating gate memory devices are non-volatile memories that use floating gate transistors to store data. The data is written to the memory cells by changing a threshold voltage of the transistor and is retained when the power is removed. To erase these transistors, a time consuming operation is performed to accurately restore the threshold voltage of the transistor. Because of this time consuming process, the memory may be arranged in erase blocks where all of the memory cells in an erase block are erased at one time. These non-volatile memory devices are commonly referred to a flash memories. While all operations of the flash memory devices are not as fast as volatile memory, advances have been experienced that make them practical replacements for some dynamic memories in processing systems.

Implementing flash memory devices can require a change in system designs to accommodate the unique aspects of the memory device. For example, programming data can require more time than storing data to a DRAM. Further, maintaining related data within a single erase block is important. That is, splitting data between two different erase blocks could result in the loss of some data due to erasure.

DRAM and flash memory devices typically have different architectures as dictated by their operation or the demands of the operating environment. As flash memory becomes a viable alternative to DRAM, a common architecture will become increasing important. For the reasons stated above, and for other reasons stated below which will become apparent to those skilled in the art upon reading and understanding the present specification, there is a need in the art for a non-volatile memory that can be implemented in a processing system while maintaining a similar configuration as a volatile memory.

SUMMARY OF THE INVENTION

The above-mentioned problems with non-volatile memories and other problems are addressed by the present invention and will be understood by reading and studying the following specification. The present invention provides a non-volatile memory that has a scrambled addressing pattern to align erase blocks primarily with array rows and secondarily with array columns.

In one embodiment, a non-volatile memory device comprises an array of memory cells arranged in rows and columns, and sense circuitry comprising a plurality of sense amplifier groups coupled to the array columns. Each group of sense amplifiers defines a page of the memory array. Addressing circuitry is provided to access the array, wherein addresses of the memory cells are scrambled to define erase blocks that cross the plurality of pages.

In another embodiment, a non-volatile memory comprises an array of memory cells arranged in rows and columns, and sense circuitry comprising a plurality of sense amplifier groups coupled to the array columns. Each group of sense amplifiers defines a page of the memory array. Erase circuitry is provided to erase blocks of the array, wherein the blocks are aligned with the memory array rows such that they cross the plurality of pages.

A flash memory device comprises an array of floating gate memory cells arranged in rows and columns, and sense circuitry comprising a plurality of sense amplifier groups coupled to the array columns. Each group of sense amplifiers defines a page of the memory array. Erase circuitry is provided to erase blocks of the array, wherein the blocks are aligned with the memory array rows such that they cross the plurality of pages. Addressing circuitry is provided to access the array, wherein addresses of the memory cells are scrambled such that each erase block contains linear addresses.

A method of operating a non-volatile memory device comprises storing data in a plurality of adjacent array pages sharing common row addresses, and erasing a block of memory cells, wherein the block comprises columns of memory cells located in the plurality of pages.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
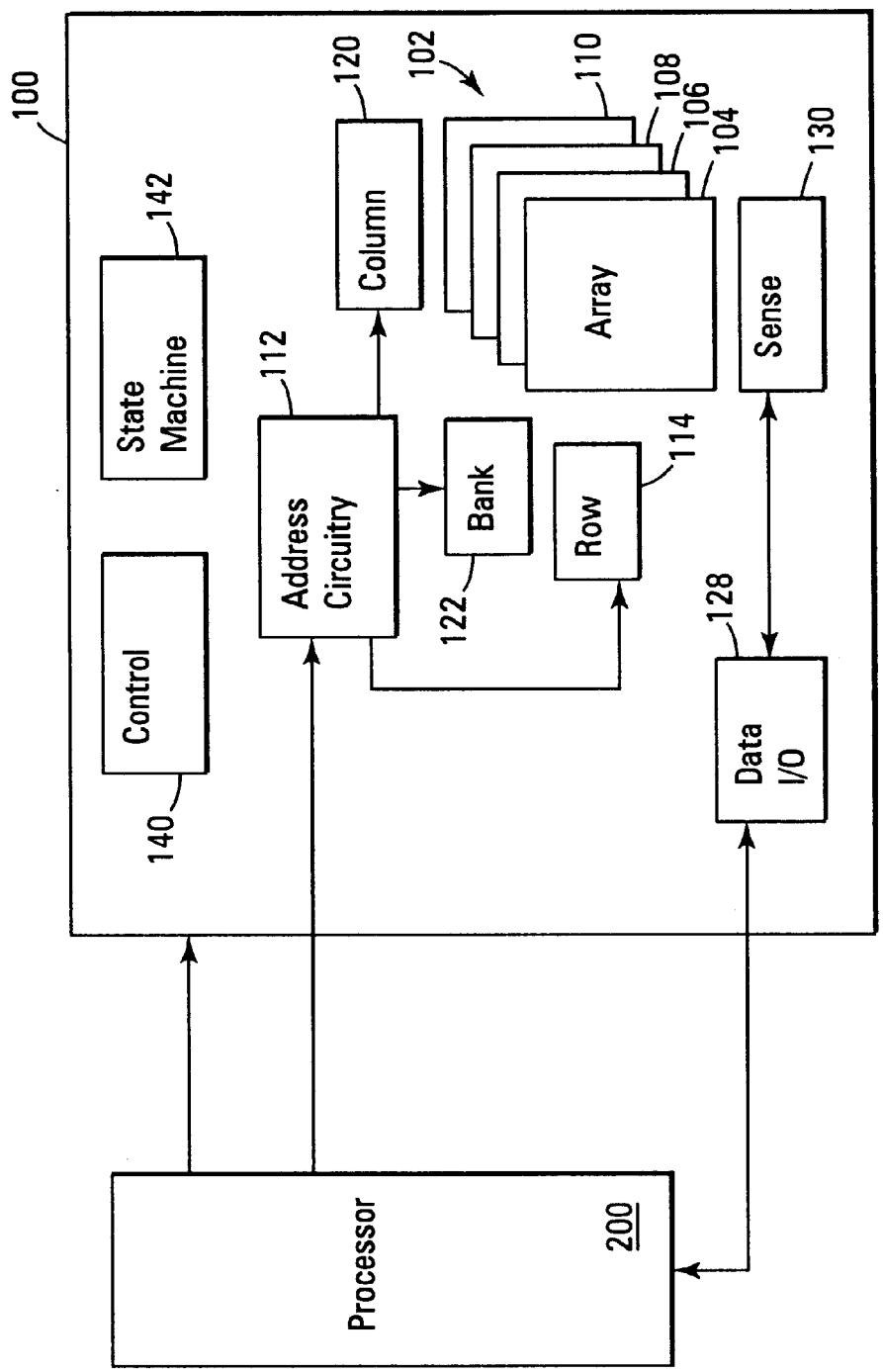
FIG. 1 is a simplified block diagram of a flash memory of the present invention.

Referring to FIG. 1, a block diagram of one embodiment of a flash memory of the present invention is described. The memory device 100 includes an array of non-volatile flash memory cells 102. The array can be arranged in a plurality of addressable banks. In one embodiment, the memory contains four memory banks 104, 106, 108 and 110. Each memory bank contains addressable blocks of memory cells. The data stored in the memory can be accessed using externally provided location addresses received by address register 112 via address signal connections. The addresses are decoded using row decode circuitry 114, column decode circuitry 120 and bank address circuit 122. Data is input and output through I/O circuit 128 via data connections and sense circuitry 130. Command execution logic 140 is provided to control the basic operations of the memory device. A state machine 142 can also provided to control specific operations performed on the memory array and cells. The command circuit 140 and/or state machine 142 can be generally referred to as control circuitry to control read, write, erase and other memory operations. The data connections are typically used for bi-directional data communication. The memory can be coupled to an external processor 200 during operation.

Figure 2:
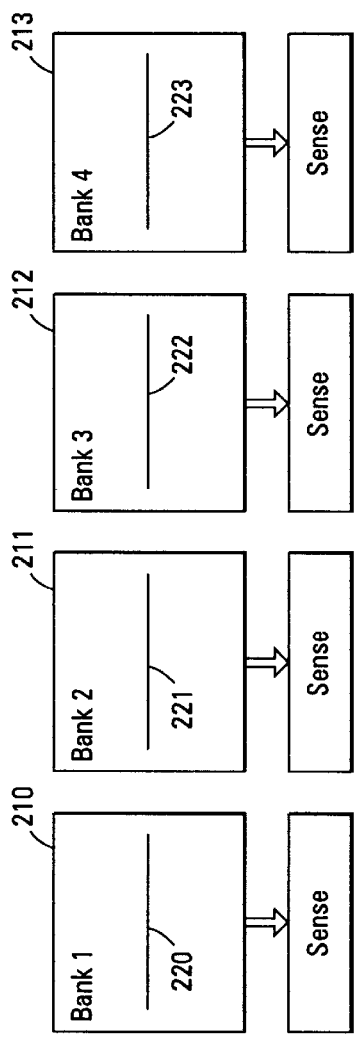
FIG. 2 illustrates a prior art DRAM array.

Prior to discussing the present invention in greater detail, a discussion of a dynamic random access memory (DRAM) is provided. Referring to FIG. 2 a prior art DRAM array is described. The array is arranged in a plurality of banks 210–213 that contain memory cells arranged in rows and columns. One architecture that is available to DRAM manufactures is to allow a row in each bank 220–223 to be opened at one time. This approach, often called stripping, allows a relatively long string of data to be read and/or written at one time. For example, a row in each array can be accessed to store a long string of data across all banks.

Figure 3:
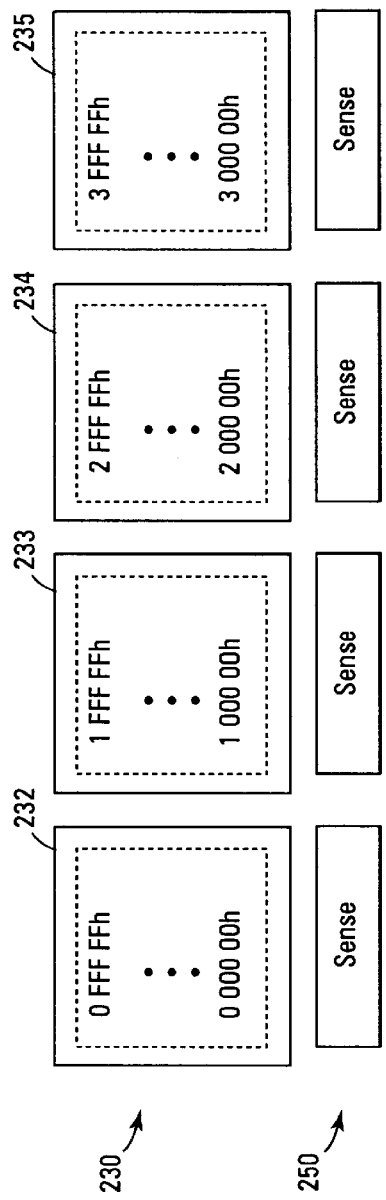
FIG. 3 illustrates a prior art flash memory array.

In contrast to the DRAM of FIG. 2, FIG. 3 illustrates a prior art flash memory array bank 230. The array is arranged in a plurality of banks (only one is illustrated) that are arranged in rows and columns. Sense amplifier/latch circuitry 250 is couplable to the bank array. For example, one bank may have 512 columns that can be coupled to 512 sense amplifiers. As such, the row length for the single block is 512 bits. The bank is divided into multiple logical pages 232–235. In this example, the bank is divided into four equal length pages of 128 columns.

As known to those in the art, flash memory devices include erase blocks (illustrated in dashed lines) where all of the memory cells in an erase block are erased during a common erase operation. As such, the pages of the bank are arranged with linear row addressing. For example, the first page contains addresses 0 000 00h to 0FFF FFh, while page 2 has addresses 10 00 00h to 1 FFF FFh. Data that is longer than the page length (128 bits), therefore, is stored in multiple rows of one page. This avoids crossing an erase block boundary between pages. It will be appreciated that if an erase block boundary is crossed, some of the data will be lost when the adjacent erase block is erased. As such, multiple read operations will have to be performed to read/write the multiple rows in one page.

Figure 4:
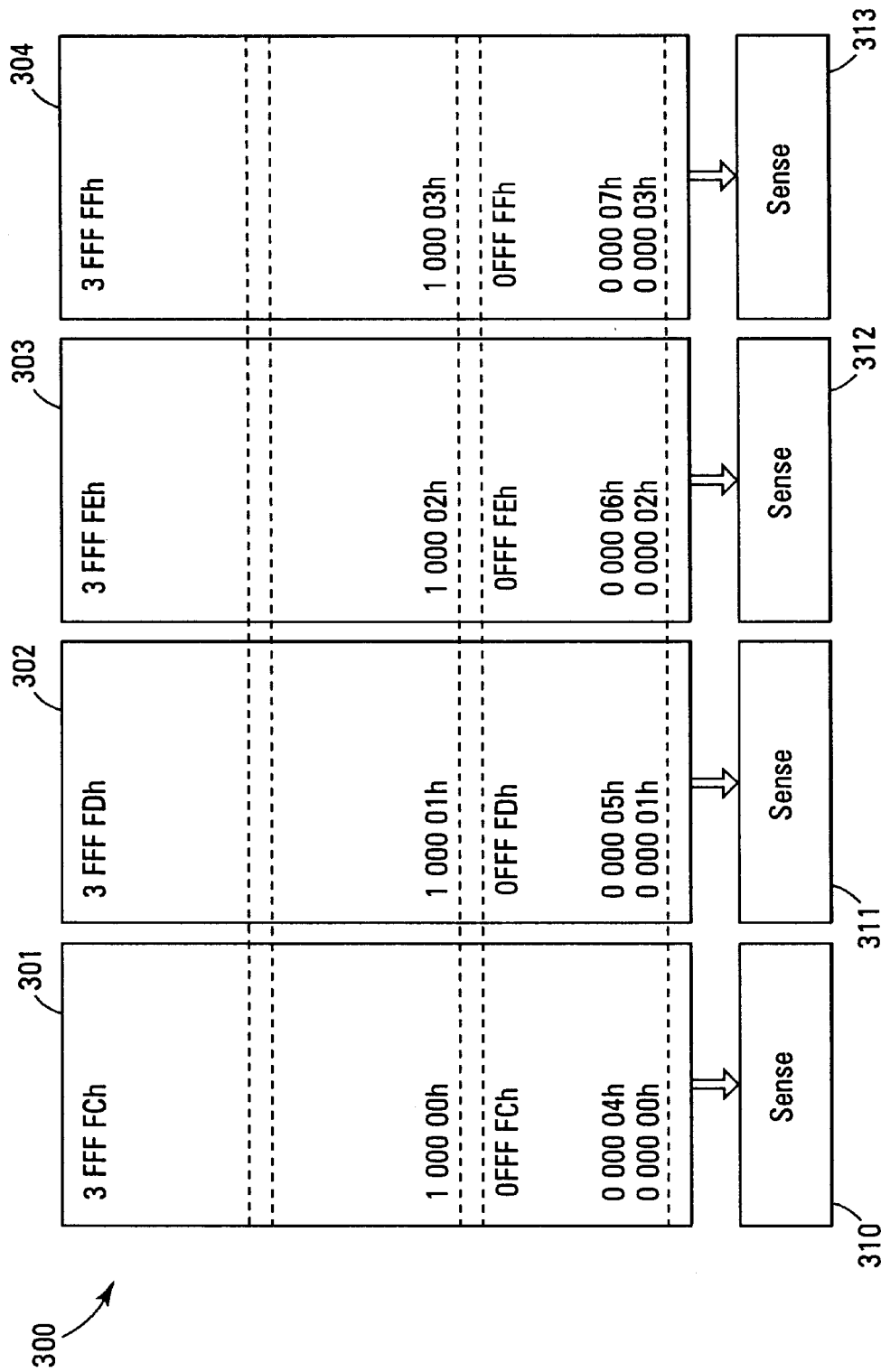
FIG. 4 illustrates an array of the memory of FIG. 1.

Referring to FIG. 4, one bank 300 of the memory array of FIG. 1 is described. The bank is divided into multiple pages 301–304, such as but not limited to four pages. Each page has a corresponding set of sense amplifier/latch circuit groups 310–313. The addressing arrangement of the pages are scrambled such that the adjacent pages contain serialized addresses. For example, one address memory map of the present invention is arranged such that erase block one contains addresses 0 000 00h to 0 FF FCh, erase block two contains addresses 0 000 01h to 0 FF FDh, erase block three contains addresses 0 000 02h to 0 FF FDh, and erase block four contains addresses 0 000 03h to 0 FF FFh. The erase blocks (illustrated with dashed lines) are arranged to cross page boundaries so that longer data packages can be read using a single read operation.

In operation, any one of the pages, or a combination of pages, can be opened for reading or writing. As such, variable length data packets can be implemented. That is, the entire block lengths or partial block lengths can be read or saved. When an erase operation is performed on an erase block, portions of each page are erased. This architectural difference is substantially different from prior art flash memory devices. By scrambling address locations in each page, the block architecture allows flexibility in reading and writing data. That is, in the above example the present invention allows 512 columns of data to be accessed in one operation, while the prior art flash memory allowed only 128 columns to be accessed without potential data retention problems. Again, the prior art could access 512 columns, but some portion(s) of the data may be lost when performing an erase operation.

CONCLUSION

A flash memory has been described that has erase blocks aligned primarily with array rows and secondarily with array columns. This architecture allows data to be stored across numerous pages without risking accidental erasure caused by crossing multiple erase blocks. As a result, the present invention allows non-volatile memory devices to.be more easily substituted for volatile memory devices. In one embodiment, a flash memory includes an array of memory cells that have a plurality of adjacent pages. Addresses of the memory cells are scrambled within the pages to define erase blocks that cross the page boundaries.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A non-volatile memory device comprising:

an array of memory cells arranged in rows and columns;

sense circuitry comprising a plurality of sense amplifier groups coupled to the array columns, wherein each group of sense amplifiers defines a page of the memory array; and addressing circuitry to access the array, wherein addresses of the memory cells are scrambled to define erase blocks that cross the plurality of pages.

2. The non-volatile memory device of claim 1 wherein the array comprises X columns divided into Y pages, and the erase blocks are X columns wide and Z rows long.

3. The non-volatile memory device of claim 2 wherein each erase block comprises at least X*Y memory cells having linear addresses.

4. The non-volatile memory device of claim 2 wherein X=512 and Y=4.

5. The non-volatile memory device of claim 1 wherein the memory cells are floating gate memory cells.

6. A non-volatile memory comprising:

an array of memory cells arranged in rows and columns;

sense circuitry comprising a plurality of sense amplifier groups coupled to the array columns, wherein each group of sense amplifiers defines a page of the memory array; and erase circuitry to erase blocks of the array, wherein the blocks are aligned with the memory array rows such that they cross the plurality of pages.

7. The non-volatile memory of claim 6 wherein the memory cells are floating gate memory cells.

8. The non-volatile memory device of claim 6 further comprising addressing circuitry to access the array, wherein addresses of the memory cells are scrambled such that each erase block contains linear addresses.

9. A flash memory device comprising:
an array of floating gate memory cells arranged in rows and columns;
sense circuitry comprising a plurality of sense amplifier groups coupled to the array columns, wherein each group of sense amplifiers defines a page of the memory array;
erase circuitry to erase blocks of the array, wherein the blocks are aligned with the memory array rows such that they cross the plurality of pages; and
addressing circuitry to access the array, wherein addresses of the memory cells are scrambled such that each erase block contains linear addresses.

10. The flash memory device of claim 9 wherein the array comprises 512 columns divided into 4 pages of 128 columns, and the erase blocks are 512 columns wide.

11. The flash memory device of claim 9 wherein the array is divided into four erase blocks.

12. The flash memory device of claim 11 wherein erase block one contains addresses 0 000 00h to 0 FF FCh, erase block two contains addresses 0 000 01h to 0 FF FDh, erase block three contains addresses 0 000 02h to 0 FF FDh, and erase block four contains addresses 0 000 03h to 0 FF FFh.

13. A processing system comprising:
a processor; and
a non-volatile memory coupled to communicate with the processor, the nonvolatile memory comprises,
an array of memory cells arranged in rows and columns,
sense circuitry comprising a plurality of sense amplifier groups coupled to the array columns, wherein each group of sense amplifiers defines a page of the memory array, and
addressing circuitry to access the array, wherein addresses of the memory cells are scrambled to define erase blocks that cross the plurality of pages.

14. The processing system of claim 13 wherein the array comprises X columns divided into Y pages, and the erase blocks are X columns wide and Z rows long.

15. The processing system of claim 14 wherein each erase block comprises at least X*Y memory cells having linear addresses.

16. A method of operating a non-volatile memory device comprising:
storing data in a plurality of adjacent array pages sharing common row addresses; and
erasing a block of memory cells, wherein the block comprises columns of memory cells located in the plurality of pages.

17. The method of claim 16 wherein memory cell addresses are scrambled such that memory cells located in each block have consecutive addresses.

18. The method of claim 16 wherein the non-volatile memory comprises an array having 512 columns divided into 4 pages of 128 columns, and four erase blocks having 512 columns.

19. The method of claim 18 wherein a first erase block contains addresses 0 000 00h to 0 FF FCh, a second erase block contains addresses 0 000 01h to 0 FF FDh, a third erase block contains addresses 0 000 02h to 0 FF FDh, and a fourth erase block contains addresses 0 000 03h to 0 FF FFh.

* * * * *

UNITED STATES PATENT AND TRADEMARK OFFICE
CERTIFICATE OF CORRECTION

PATENT NO. : 6,587,383 B1
DATED : July 1, 2003
INVENTOR(S) : Frankie Roohparvar

It is certified that error appears in the above-identified patent and that said Letters Patent is hereby corrected as shown below:

Column 3,
Line 56, replace "FDh" with -- FEh --

Column 5,
Line 22, replace "FDh" with -- FEh --

Column 6,
Line 27, replace "FDh" with -- FEh --

Signed and Sealed this

Seventh Day of October, 2003

JAMES E. ROGAN
*Director of the United States Patent and Trademark Office*